United States Patent
Jia et al.

(10) Patent No.: US 6,633,188 B1
(45) Date of Patent: Oct. 14, 2003

(54) SENSE AMPLIFIER-BASED FLIP-FLOP WITH ASYNCHRONOUS SET AND RESET

(75) Inventors: Wenyan Jia, Milpitas, CA (US); Borivoje Nikolic, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 445 days.

(21) Appl. No.: 09/248,957

(22) Filed: Feb. 12, 1999

(51) Int. Cl.[7] .................................................. H03K 3/12
(52) U.S. Cl. ........................ 327/217; 327/52; 327/212; 365/205
(58) Field of Search .................... 327/185, 199–203, 327/208, 210–212, 214, 215–218, 51–56; 365/196, 205

(56) References Cited

U.S. PATENT DOCUMENTS

| | | | | |
|---|---|---|---|---|
| 3,591,856 A | * | 7/1971 | Kalb | 327/204 |
| 5,140,180 A | * | 8/1992 | Crafts et al. | 327/203 |
| 5,532,634 A | * | 7/1996 | Sato | 327/216 |

* cited by examiner

*Primary Examiner*—Minh Nguyen
(74) *Attorney, Agent, or Firm*—W. Daniel Swayze, Jr.; W. James Brady; Frederick J. Telecky, Jr.

(57) ABSTRACT

A flip-flop including a first stage and a second stage. The first stage receives a pair of differential signals to generate a set and reset signal. The complement of the set and reset signal generates output signals Q and Q'. These signals have rising and falling transistors with the same delays for the Q signal and the Q signal. The second stage has symmetrical pull-up and pull-down circuits.

8 Claims, 6 Drawing Sheets

SENSE AMPLIFIER-BASED FLIP-FLOP WITH ASYNCHRONOUS SET AND RESET

FIELD OF THE INVENTION

The present invention relates to digital logic circuits and more particularly to a flip-flop circuit.

BACKGROUND OF THE INVENTION

All digital systems use timing devices such as latches and flip-flops as part of the digital system. As the operating frequencies increase and the number of logic gates between timing elements are reduced, timing constraints are reflected on the design of flip-flops. Additionally, low delay from the clock input to data output, shorter setup and hold times are required. Other critical elements of high-speed flip-flop design are low-power operation, small size and low clock load.

Many digital systems, require incorporation of asynchronous set and reset in these flip-flops. This requirement is common in communications and digital signal processing applications, such as modems, or disk-drive read channels.

Figure 1:
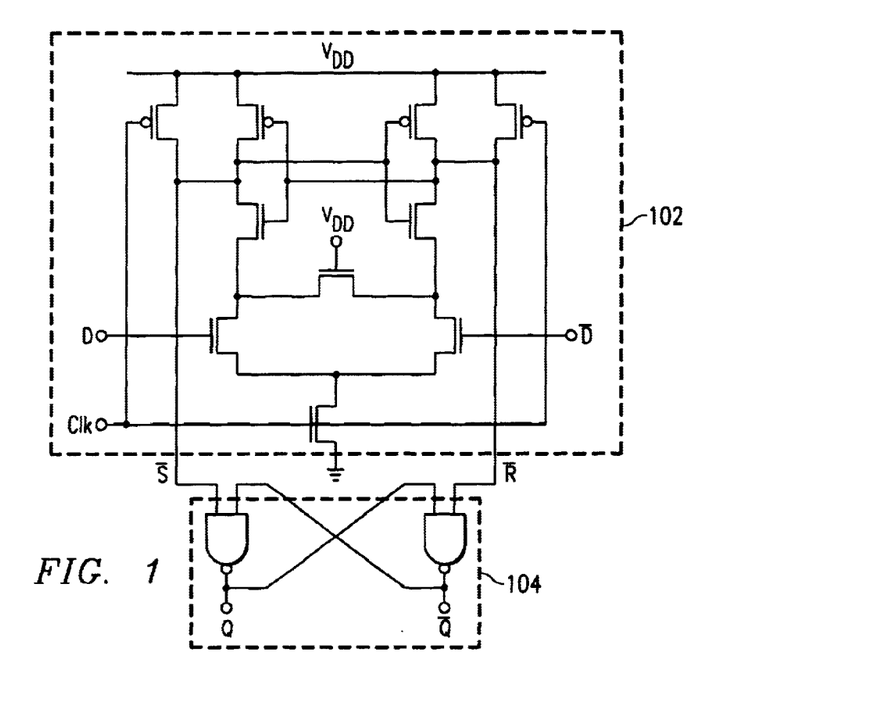
FIG. 1 illustrates a flip-flop.

The prior art has presented many flip-flop structures. One such flip-flop structure is illustrated in FIG. 1. This flip-flop has a first stage 102 and a second stage 104. The second stage 104 includes an R-S latch. The first stage 102 of this flip-flop includes a sense amplifier which is widely used in memory integrated circuits. Differential inputs D and $\overline{D}$ of the first stage 102 sense the difference between the inputs. The inputs to the first stage 102 can be obtained from either a dual or single-rail logic. With single-rail logic, a complementary output can be generated by use of an inverter. This sense amplifier stage produces monotonous transitions from the high to low logic levels at nodes $\overline{S}$ and $\overline{R}$ on the leading clock edge, and the S-R latch captures each monotonous transition and holds the state until the next leading clock edge arrives. Thus, the whole structure operates as a flip-flop.

The S-R latch operates such that the input $\overline{S}$ is a set input and $\overline{R}$ is a reset input. The low level at both $\overline{S}$ and $\overline{R}$ inputs are not simultaneously permitted, and this low level at both $\overline{S}$ and $\overline{R}$ is prevented by the sense-amplifier stage 102. The low level at $\overline{S}$ sets the Q output to high, which in turn forces the $\overline{Q}$ to low. Conversely, the low level at $\overline{R}$ sets the $\overline{Q}$ to high, which in turn forces Q to low. Thus, one of the outputs is always delayed with respect to the other.

Sense amplifier-based flip-flops achieve very small delay between the latest point of data arrival (consisting of the sum of setup time and clock-to-output delay), but integration of asynchronous set and reset functions has not been accomplished.

SUMMARY OF THE INVENTION

The sense-amplifier flip-flop of the present invention provides asynchronous set and reset functions.

The present invention allows the first stage of the sense amplifier based flip-flop to incorporate the asynchronous set and reset. Since the sense amplifier flip-flop is pulse triggered, the asynchronous set and reset features should be incorporated in the first stage for proper setting and resetting as well as for the recovery to normal mode of operation.

Incorporation of asynchronous set and reset into the sense amplifier-based flip-flop has small impact on the speed, and does not adversely affect other properties. The output stage from FIG. 2 has the same delays of both true Q and complementary outputs $\overline{Q}$ and the same delays for both falling and rising edges.

Asynchronous set and reset signals are implemented in the first stage, and these set and reset signals change the outputs via $\overline{S}$ and $\overline{R}$ signals.

Additionally, the transitions of the output signals Q and $\overline{Q}$ depend only on transitions of signals $\overline{S}$ and $\overline{R}$.

When the clock signal is low, in normal operation, nodes $\overline{S}$ and $\overline{R}$ are precharged through two transistors. This precharging is gated by two other transistors for the asynchronous set and reset insertion. If flip-flop is in the set or reset state, $\overline{S}$ and $\overline{R}$ nodes are not precharged.

In normal operation, the high states of $\overline{S}$ and $\overline{R}$ keeps a pair of transistors on, charging their sources to a predetermined voltage since there is no path to ground due to the clocked off state of an additional transistor. The sense-amplifier stage is triggered on the leading edge of the clock. If the signal D is high, node $\overline{S}$ is discharged through a first path. If $\overline{D}$ is high, node $\overline{R}$ is discharged through a second path. After this change, additional changes of the data inputs will not affect the state of $\overline{S}$ and $\overline{R}$ nodes. The inputs are decoupled from the outputs of the sense amplifier and thus form the basis for the flip-flop operation of the circuit.

The transitions generated by the sense amplifier are captured in the S-R latch to produce a new flip-flop state.

The present invention provides the integration of the asynchronous set and reset functions into the flip-flop with small impact on the performance.

DETAILED DESCRIPTION OF THE PRESENT INVENTION

Figure 2:
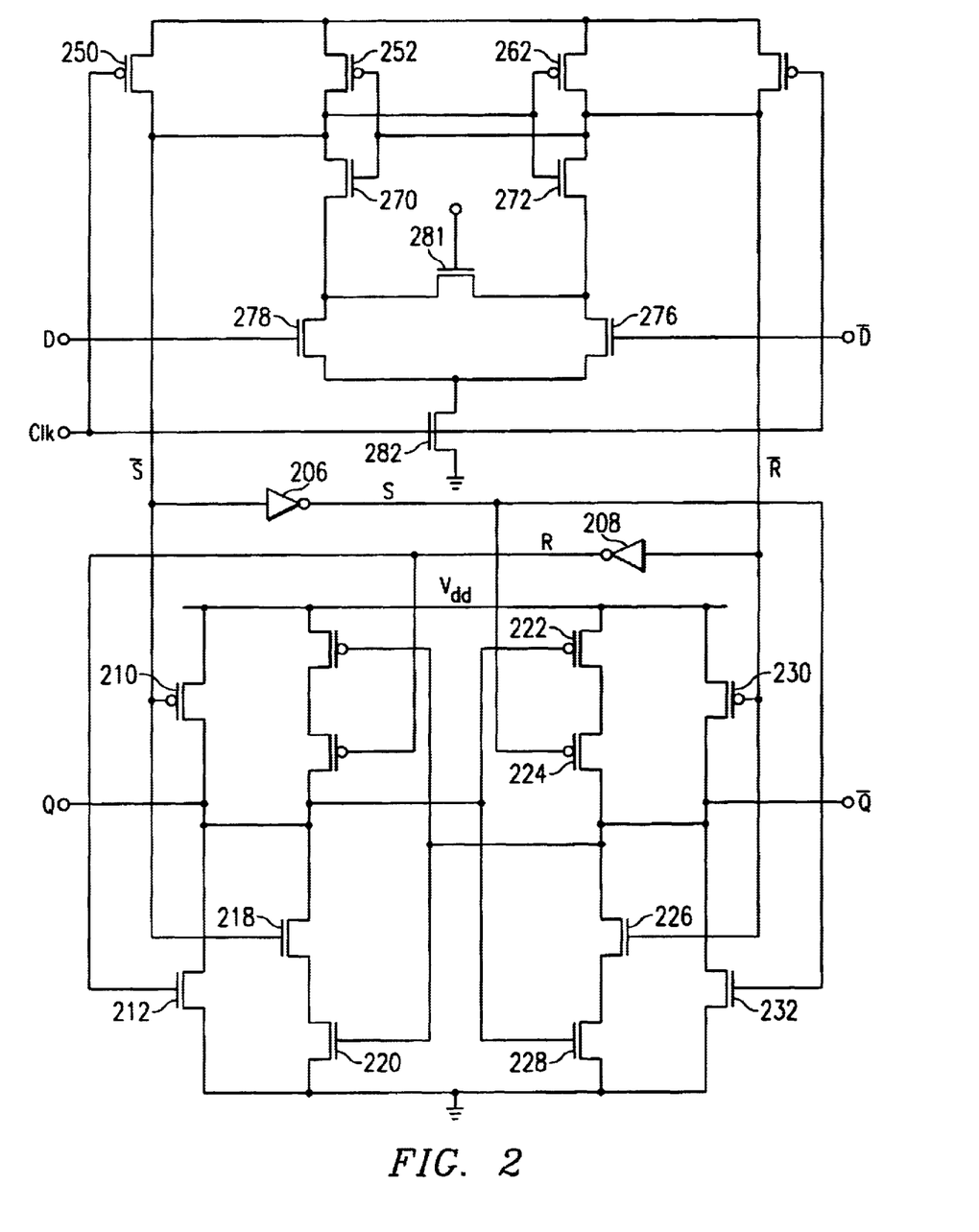
FIG. 2 illustrates a sense amplifier-based flip-flop.
Figure 3:
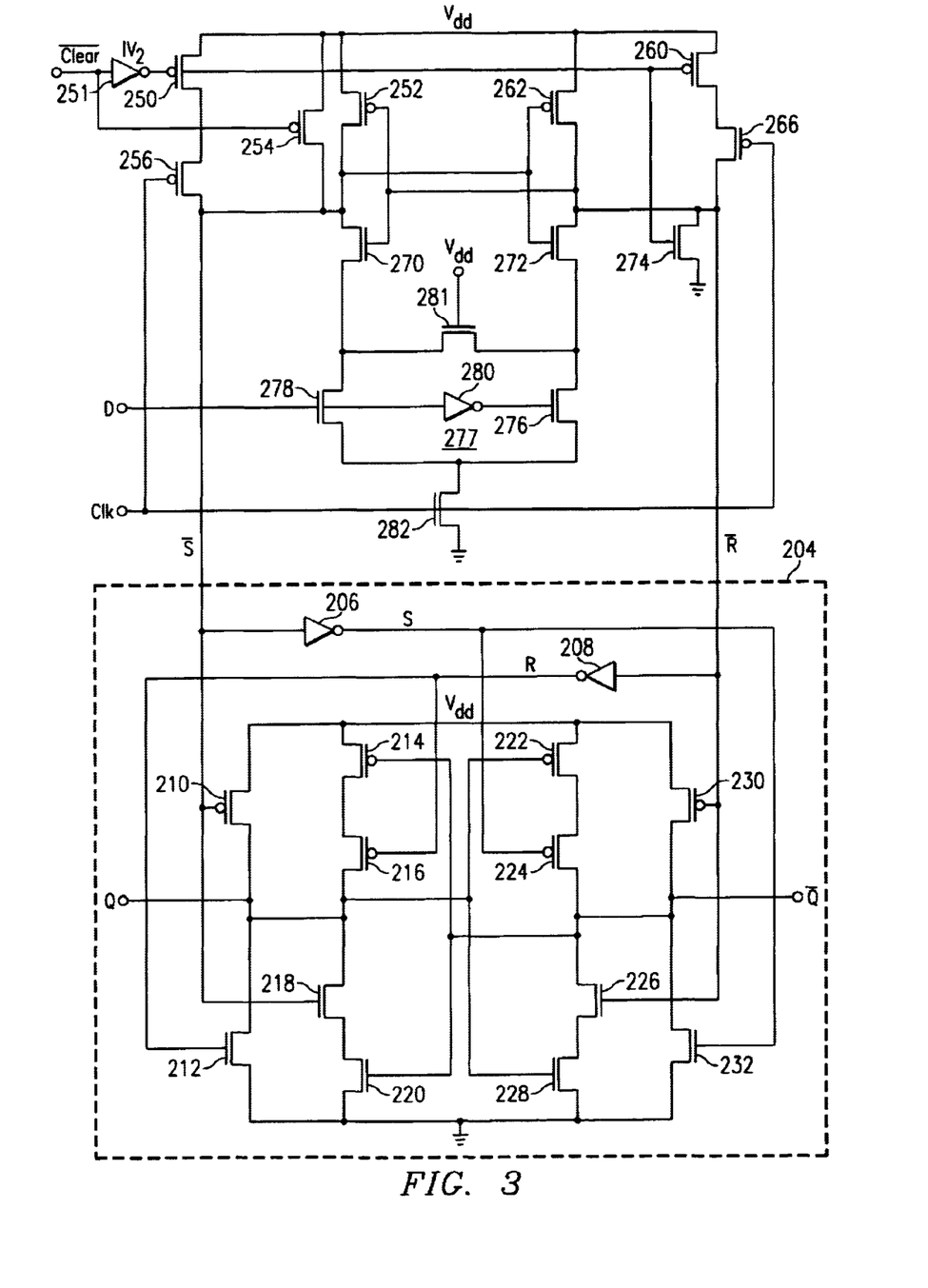
FIG. 3 illustrates a sense amplifier-based flip-flop with asynchronous reset.
Figure 4:
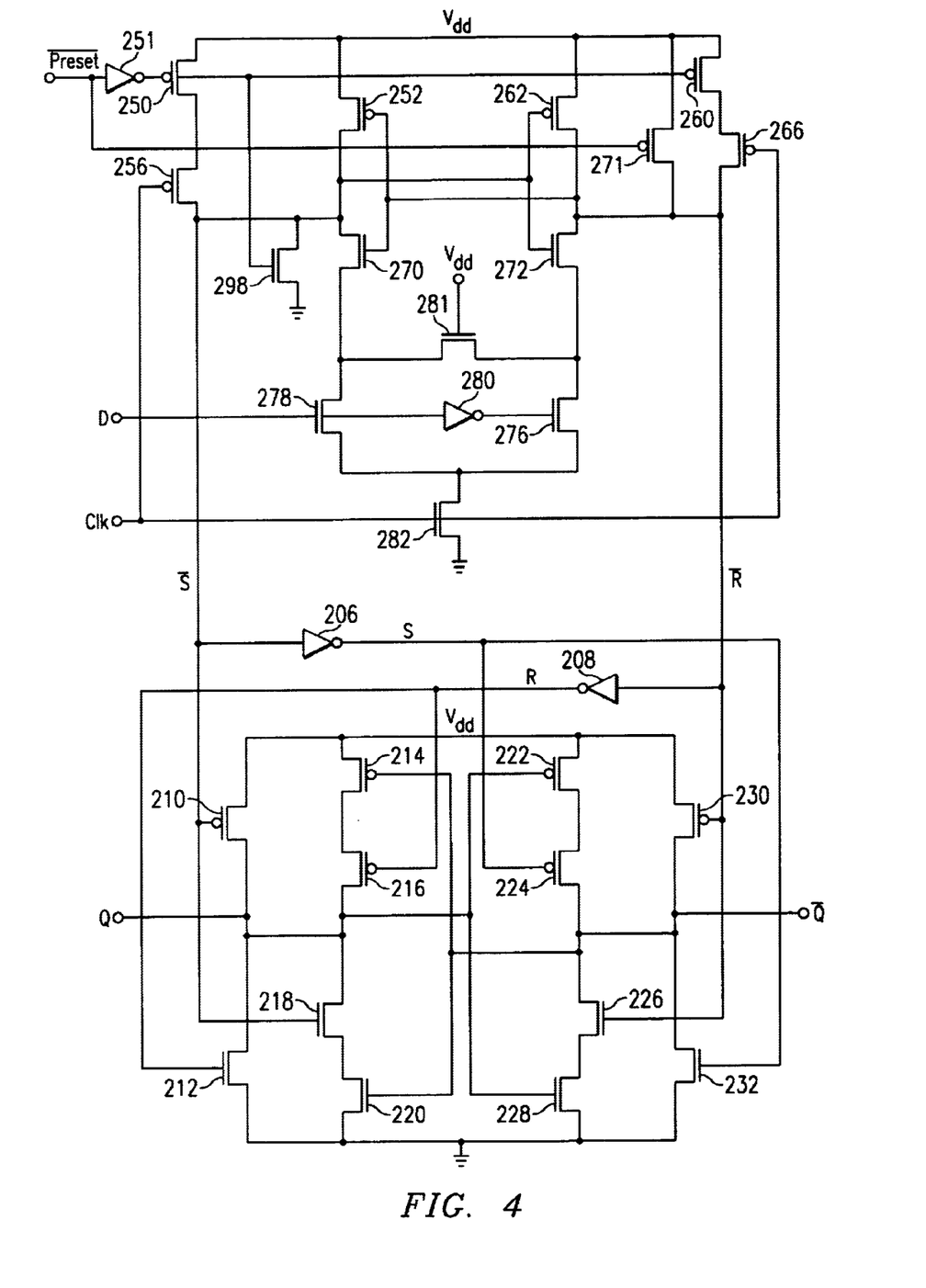
FIG. 4 illustrates a sense amplifier-based flip-flop with asynchronous preset.
Figure 5:
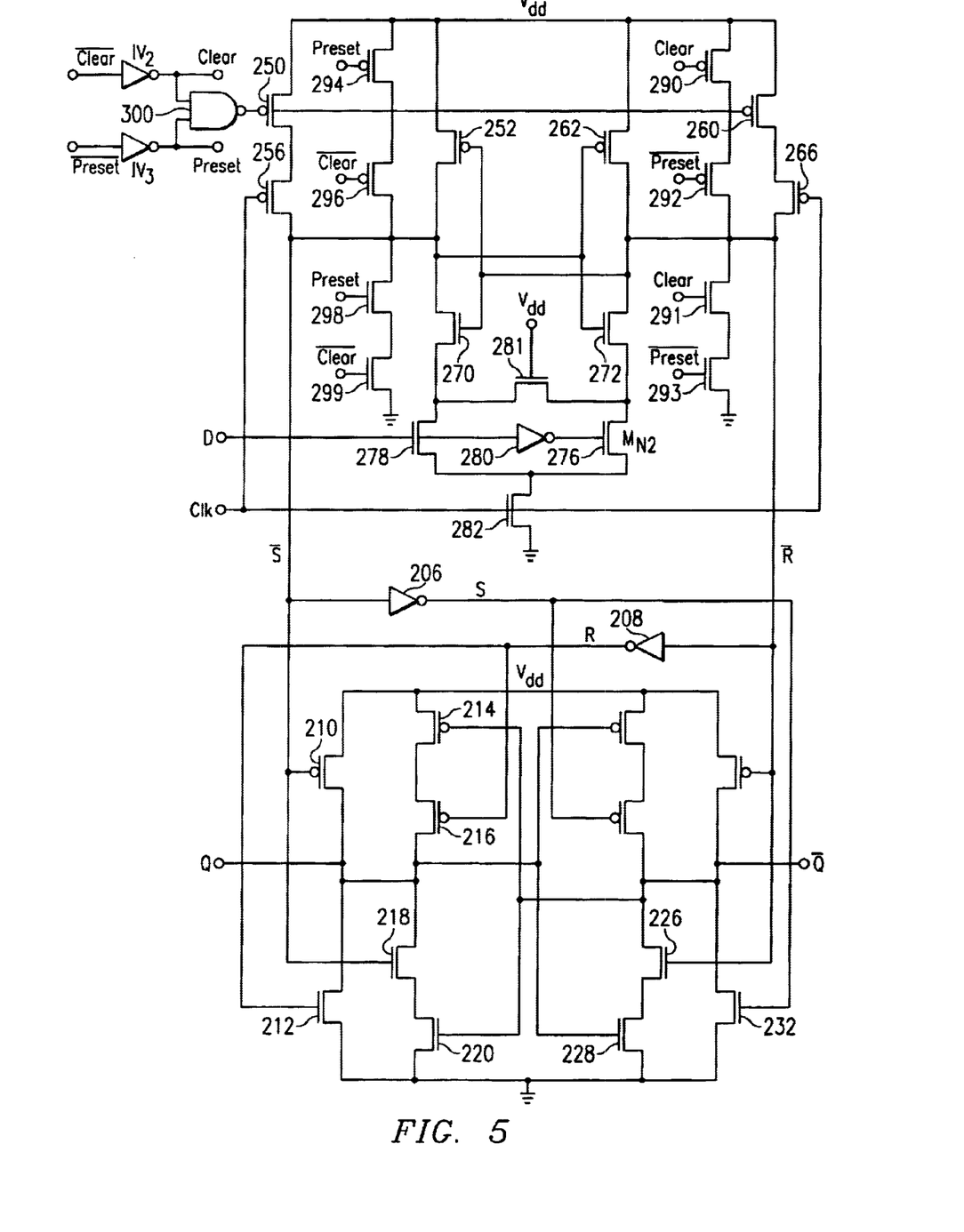
FIG. 5 illustrates a sense amplifier-based flip-flop with asynchronous reset and preset.

FIG. 3 shows the sense-amplifier 202 and flip-flop 204 with asynchronous reset (clear), and FIG. 4 shows the sense amplifier based flip-flop with asynchronous set (preset). Flip-flop with both set and reset is shown in FIG. 5. All the flip-flops are shown with single-ended inputs. The differential inputs from FIG. 1 and FIG. 2 are converted to single-ended by the use of an inverter to provide the different signal polarity between the inputs.

The circuit shown in FIG. 3 operates as follows. In normal operation of the flip-flop, asynchronous reset signal $\overline{\text{Clear}}$ is kept high. Asserting signal $\overline{\text{Clear}}$ low resets the flip-flop with no regard to the state of the clock signal. Therefore, the operation of asserting signal $\overline{\text{Clear}}$ low is asynchronous.

While signal $\overline{\text{Clear}}$ is high, the output of inverter 251 is low, transistor 250 and transistor 260 are on, since the input to transistor 250 and transistor 260 is low, and transistor 254 and transistor 274 are off, since the input to transistor 254 is high and transistor 274 is low. This arrangement allows normal flip-flop operation. When Clk signal is low, transistor 256 and transistor 266 are turned on. When Clk signal is low, node labeled $\overline{S}$ is precharged through transistors 250 and 256, and node labeled $\overline{R}$ is precharged through transistors 260 and 266 to voltage $V_{DD}$. The high state resulting from the precharged voltage of $\overline{S}$ and $\overline{R}$ keeps transistor 270 and transistor 272 on, charging their sources up to $V_{DD}-V_{tN}$ because there is no path to ground due to the off state of the clocked transistor 282. Since either transistor 278 or transistor 276 is on as a result of D being either high or low, the common node of transistor 278, transistor 276, and transistor 282 is also precharged to $V_{DD}-V_{tN}$. Therefore, prior to the leading clock edge, all the parasitic capacitances of every node in the differential tree of transistors 252, 262, 270, 272, 278, and 276 are precharged.

The sense amplifier stage is triggered on the leading edge of the clock. If D is high, node $\overline{S}$ is discharged through the path of transistor 270, transistor 278, and transistor 282, turning transistor 272 off and transistor 262 on. If D is low, node $\overline{R}$ is discharged through the path of transistor 272, transistor 276, and transistor 282, turning transistor 270 off and transistor 252 on. After this initial change, further changes of data inputs will not affect the state of the $\overline{S}$ and $\overline{R}$ nodes. The transistor 281 allows static operation, providing a path to ground through transistors 278 or 276 and 282 even after the input data D is changed, for example, which prevents the potential charging of the low output of the sense-amplifier stage, due to the leakage currents.

FIG. 3 illustrates that transistors 250 and 260 prevent precharge of the capacitors. FIG. 3 additionally illustrates that transistors 254 and 274 provide asynchronous operation.

Asserting signal $\overline{Clear}$ to low switches off transistor 250 and transistor 260, which provides the basis for resetting the flip-flop. This prevents the precharging of nodes $\overline{S}$ and $\overline{R}$. Signal $\overline{Clear}$, when low, also switches on transistor 254 and transistor 274, to force the state of the latch that consists of transistor 270 off, transistor 272 on, transistor 252 on, and transistor 262 off. This state of the latch is the signal $\overline{S}$ high and signal $\overline{R}$ low to keep the second stage of the flip-flop reset during the time while $\overline{Clear}$ is low resulting in signal Q low and signal $\overline{Q}$ high.

When signal $\overline{Clear}$ is switched back from low to high logic level, the flip-flop returns to its normal mode of operation. The first stage keeps the reset state until the arrival of the next clock edge. The setup time for the recovery from the reset state is determined by ability to precharge the $\overline{S}$ and $\overline{R}$ nodes through transistor 250 and transistor 260, that are on again as well as through transistors 256 and 266. The waveform of the reset flip-flop is given in FIG. 6.

FIG. 4 illustrates another circuit including a flip-flop with asynchronous set (preset). It operates in the similar way as the flip-flop with asynchronous reset. In normal operation of the flip-flop, asynchronous set signal $\overline{Preset}$ is kept high. Asserting signal $\overline{Preset}$ low sets the flip-flop. Asserting signal $\overline{Preset}$ low, switches off transistor 250 and transistor 260, which provides the basis for setting the flip-flop. This prevents the precharging of nodes $\overline{S}$ and $\overline{R}$. Signal $\overline{Preset}$ also switches on transistor 271 and transistor 298, to force the state of the latch that consists of transistor 270 on, transistor 272 off, transistor 252 off, and transistor 262 on. This forces the signal $\overline{S}$ low and signal $\overline{R}$ high to keep the second stage of the flip flop set during the time while $\overline{Preset}$ is low resulting in Q being high and $\overline{Q}$ being low. In FIG. 4, transistors 271 and 298 provide asynchronous set.

When signal $\overline{Preset}$ is switched back from low to high logic level, the flip-flop returns to its normal mode of operation. The flip-flop keeps the previous set state until the arrival of the next clock edge. The setup time for the recovery from the set state is determined by ability to precharge the $\overline{S}$ and $\overline{R}$ nodes through transistor 250 and transistor 260, that are on again as well as through transistors 256 and 266.

FIG. 5 illustrates a circuit of a flip-flop with asynchronous reset and set (preset) signals. If both $\overline{Clear}$ and $\overline{Preset}$ are kept high, transistors 250 and 260 are always on, and transistors 294, 290, 299 and 293 are on, and transistors 296, 292, 298 and 291 are off. The flip-flop operates in normal conditions. If any of $\overline{Clear}$ and $\overline{Preset}$ signals is asserted low, the output of the OR gate 300 from FIG. 5 keeps the transistors 250 and 260 off to prevent precharging of nodes $\overline{S}$ and $\overline{R}$, and thus allows for the forcing of the state of transistors 252, 262, 270 and 272.

In FIG. 5, transistors 250 and 260 prevent precharging while transistors 291 and 296 provide asynchronous set signal and transistors 292 and 298 provide asynchronous reset signal. Additionally, FIG. 5 illustrates that transistors 294 and 299 and transistors 290 and 293 prevent short circuit connection (and the resulting damage of circuits) if both $\overline{Preset}$ and $\overline{Clear}$ are asserted.

If the signal $\overline{Preset}$ is asserted low while signal $\overline{Clear}$ stays high, transistors 298, 299, 290 and 292 are switched on, while transistors 291, 293, 294 and 296 stay off. This forces the state of signal $\overline{S}$ to low and signal $\overline{R}$ to high which asynchronously sets the flip-flop.

Similarly, if the signal $\overline{Clear}$ is asserted low while signal $\overline{Preset}$ stays high, transistors 291, 293, 294 and 296 are switched on, while transistors 298, 299, 290 and 292 stay off. This forces the state of signal $\overline{S}$ to high and signal $\overline{R}$ to low, which asynchronously resets the flip-flop.

Transistors 298, 291, 296 and 292 are important for implementing the set and reset functions. Additional transistors 299, 293, 294 and 290 are added to avoid a short circuit path in case when both signal $\overline{Clear}$ and signal $\overline{Preset}$ are accidentally asserted low. These additional transistors provide that in case when both signals $\overline{Clear}$ and $\overline{Preset}$ are asserted low, the flip-flop keeps the previous state.

In all modes of operation, the transitions generated in the first stage are captured by the S-R latch in the second stage and kept until the next transition is generated.

S-R latch, as illustrated in FIG. 3, FIG. 4, and FIG. 5, provides two possible logic representations for the output Q: Q=S+$\overline{R}$Q' and Q=$\overline{R}$·(S+Q'), in order to produce four equivalent pull-up and pull-down transistor circuits represented by the following equations:

Q=S+$\overline{R}$Q', ($\overline{Q}$)=R+$\overline{S}$·Q', $\overline{Q}$=$\overline{S}$·(R+$\overline{Q}$'), ($\overline{Q}$)=$\overline{R}$·(S+Q')

The signals Q' and $\overline{Q}$' are the states (or logic) levels of the output in the previous clock cycle.

Pull-up circuits raise the voltage of the node which they connect to the supply voltage. Pull-down circuits lower the voltage of the node which they are connected to ground. Both Q and $\overline{Q}$ have a separate pull-up and pull-down circuit. These circuits are symmetrical with respect to output signals Q and $\overline{Q}$. Signal Q is output from a first current path from $V_{DD}$ to ground, and signal $\overline{Q}$ is output from a second current path from $V_{DD}$ to ground. The first current path includes a first pull-down circuit, transistors FET 212, FET 218 and FET 220, and a first pull-up circuit, transistors PFET 210, PFET 214 and PFET 216.

The second current path includes a second pull-down circuit, FET 232, FET 226 and FET 228, and a second pull-up circuit, PFET 230, PFET 222 and PFET 224. The output signal Q is high when a current path exists through transistors PFET 214 and PFET 216 or a current path exists through PFET 210.

The output signal Q is low when a current path exists through either FET 218 and FET 220, or FET 212.

The output signal $\overline{Q}$ is high when a current path exists through PFET 222 and PFET 224 or through PFET 230.

The output signal $\overline{Q}$ is low when a current path exists through FET 226 and FET 228 or through FET 232.

As a result of this symmetrical design, the rising and falling edge of signals Q and $\overline{Q}$ are subject to the same delays. This occurs because the signals are in response to signals S and R and signals $\overline{S}$ and $\overline{R}$. These signals control both directly and indirectly the same number and arrangement of circuit elements. This, by proper sizing of transistors, translates in the same delay. This design applies normal clocked operation as well as asynchronous operation.

Since the output stage 204 is symmetric with respect to pull-up and pull-down circuits for Q and $\overline{Q}$, the implementation of both pull-ups and pull-downs use the same circuit and thus make the output stage symmetrical. Typically, one transistor "driver" in each branch is active in changing the state, allowing the other transistors, namely keeper transistors, to be small in size. Since PFETs have charge mobility roughly two times slower than NFET, the size of PFET pull-up networks has to be doubled compared to the NMOS networks in a CMOS structure. To achieve the same delays in this structure, it is possible to size the FETs such that the delay of the PMOS network is similar to the delay of the NMOS network following the inverter. (This is important, because in the prior art, no sizing could adjust the delays; there is always going to be one gate delay difference.) One set 250 of keeper transistors are, for example, PFET 214, PFET 222, PFET 216 and PFET 224. Another set 252 of keeper transistors are FET 218, FET 226, FET 220 and FET 228. Since the size of these keeper transistors is small, they can be quickly switched off during any transition which allows driver transistors PFET 210, PFET 230, PFET 212 and PFET 232 to drive the load and to change the state of the latch. The keeper transistors can be switched off quicker than the driver transistors. When both signals $\overline{S}$ and $\overline{R}$ are at high logic levels, transistors PFET 210, PFET 230, FET 212 and FET 232 are off. Additionally, PFET 216, PFET 224, FET 218 and FET 226 are on. This allows transistors PFET 214, PFET 222, FET 220 and FET 228 to keep the present state (logic levels) for both true and complementary outputs. After a rising edge of the clock signal is received, either one of the precharged sense-amplifier outputs, either $\overline{S}$ or $\overline{R}$ discharges to ground. The operation of the sense amplifier 202 dictates that only one of these signals $\overline{S}$ or $\overline{R}$ can discharge at each clock transition. If $\overline{S}$ discharges to a zero state and $\overline{R}$ remains at $V_{DD}$, signal S rises from 0 to $V_{DD}$ after an inverter delay. Since transistors FET 218 and PFET 224 are sized small, they can be switched off quickly, allowing the driver transistors PFET 210 and FET 232 to change the true output Q state to a high logic level $V_{DD}$, and the complementary output to a low level. Conversely, if $\overline{R}$ discharges and $\overline{S}$ stays at $V_{DD}$, signal R rises from 0 to $V_{DD}$ after an inverter delay due to inverter 208. Since transistors FET 226 and PFET 216 are sized small, these transistors can be switched off quickly, allowing the driver transistors PFET 230 and FET 212 to change the true output state Q to logic level 0 and the complementary output $\overline{Q}$ to $V_{DD}$.

High-speed digital systems create large fan-outs at flip-flop outputs, which puts additional requirements on the flip-flop design by scaling the sizes of transistors PFET 210, PFET 230, FET 212 and FET 232. In addition, their size can be adjusted such that both transitions of the output, from high to low and from low to high, have the same delay by matching the delay of the PMOS FETs to the delay of the inverter and the NMOS FETs.

Turning now to FIG. 3, the second stage 204 includes an inverter 206 to invert the signal $\overline{S}$ to the signal S and an inverter 208 to invert the signal $\overline{R}$ and to output R signal. A gate of PFET 210 is connected to receive signal $\overline{S}$. The gate of PFET 210 is connected to the drain of PFET 234. The source of PFET 210 is connected to voltage $V_{DD}$. The gate of FET 212 is connected to the output of inverter circuit 208. Thus, the gate of transistor 212 is controlled by the signal R. The drain of transistor FET 212 is connected to the drain of PFET 210. The source of FET 212 is connected to the source of FET 222 and additionally connected to ground. The gate of FET 222 is connected to the drain of FET 226 as well as the gate of PFET 214. The drain of FET 222 is connected to the source of FET 218. The drain of FET 218 is connected to the drain of PFET 216. Additionally, the drain of FET 218 is connected to output Q. The source of PFET 216 is connected to the drain of PFET 214. The source of PFET 214 is connected to the source of PFET 210. The gate of FET 228 is connected to the gate of FET 222. The source of FET 228 is connected to ground with the drain of FET 228 connected to the source of FET 226. The drain of FET 226 is connected to the drain of PFET 224, and the source of PFET 224 is connected to the drain of PFET 222. The gate of PFET 224 is connected to the output of inverter 206 to receive the signal S. The gate of FET 230 is connected to the output of inverter 206. The output of inverter 206 is signal S which controls FET 232 and PFET 224. The source of FET 232 is connected to ground while the drain of FET 232 is connected to the drain of PFET 230. The gate of PFET 230 is connected to the drain of PFET 236. The signal $\overline{R}$ controls the gate of PFET 230. The source of PFET 230 is connected to the source of PFET 214 and the source of PFET 214, PFET 210 and PFET 222.

As illustrated in FIG. 3, a $\overline{Clear}$ signal is input to inverter 251. The output of inverter 251 is input to the gate of transistor 250. The source of transistor 250 is connected to voltage $V_{DD}$. The drain of transistor 250 is connected to the source of transistor 256. The drain of transistor 256 is connected to node $\overline{S}$. The gate of transistor 256 is connected to receive the Clk signal. Additionally, the gate of transistor 250 is connected to the gate of transistor 260. The source of transistor 260 is connected to voltage $V_{DD}$. The drain of transistor 260 is connected to the source of transistor 266. The drain of transistor 266 is connected to node $\overline{R}$. The gate of transistor 266 is connected to receive the signal Clk. The gate of transistor 254 is connected to receive the signal $\overline{Clear}$ while the source of transistor 254 is connected to voltage $V_{DD}$. The drain of transistor 254 is connected to node $\overline{S}$. The drain of transistor 254 is connected to the drain of transistor 252 and the drain of transistor 270. The source of transistor 252 is connected to voltage $V_{DD}$. The gate of transistor 252 is connected to the gate of transistor 270 which is connected to the drain of transistor 262 and the drain of transistor 272. The drain of transistor 252 and the drain of transistor 270 are connected to the drain of transistor 262 and the gate of transistor 272. The source of transistor 262 is connected to voltage $V_{DD}$. The drain of transistor 272 is connected to the drain of transistor 262. The source of transistor 272 is connected to the source of transistor 276. The gates of transistor 272 are connected to the gate of transistor 262 which is in turn connected to the drain of transistor 252 and the drain of transistor 270. The source of transistor 272 is connected to the drain of transistor 281, and the source of transistor 270 is connected to the source of transistor 281. The gate of transistor 281 is connected to voltage $V_{DD}$. The source of transistor 272 is connected to the drain of transistor 276. The source of transistor 276 is connected to the source of transistor 278. The drain of transistor 278 is connected to the source of transistor 270. The gate of transistor 278 is connected to receive the data signal D and connected to the input of inverter 280. The output of inverter 280 outputs the signal $\overline{D}$ and is connected to the gate of transistor 276. The drain of transistor 282 is connected to the source of transistor 278 and the source of transistor 276. The source of transistor 282 is connected to ground, and the gate of transistor 282 is connected to receive the signal Clk. Transistors 250 and 256 can be interchanged; transistors 260 and 266 can be interchanged; and transistors 294 and 296 can be interchanged.

In FIG. 4, the gate of transistor 271 is connected to receive the preset signal. This transistor 271 includes a source connected to voltage $V_{DD}$, and the drain of transistor 271 is connected to the drain of transistor 262 and the drain of transistor 266. Transistors 290 and 292 can be interchanged; transistors 298 and 299 can be interchanged; and transistors 291 and 293 can be interchanged.

In FIG. 5, the source of transistor 294 is connected to voltage $V_{DD}$. The drain of transistor 294 is connected to the source of transistor 296, and the drain of transistor 296 is connected to the drain of transistor 298. The source of transistor 298 is connected to the drain of transistor 299, and the source of transistor 299 is connected to ground. Additionally, the source of transistor 290 is connected to voltage $V_{DD}$ while the drain of transistor 290 is connected to the drain of transistor 292. The drain of transistor 292 is connected to the drain of transistor 291. The source of transistor 291 is connected to the drain of transistor 293 while the source of transistor 293 is connected to ground. The gates of transistors 294, 298, 292 and 293 receive the preset signal while the gates of transistors 290, 291, 296 and 299 receive the $\overline{Clear}$ signal. Furthermore, interchanging the connection of devices 214 and 216, or 222 and 224, or 218 and 220, or 226 and 228 does not change the functionality of the circuit, but may slightly slow it down.

Figure 6:
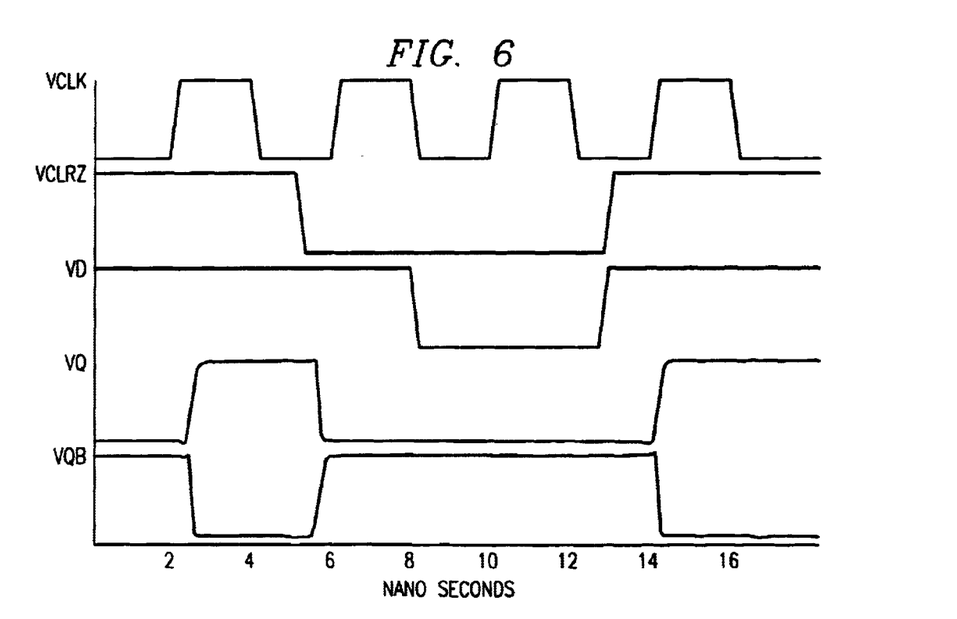
FIG. 6 illustrates waveform of a sense amplifier-based flip-flop with asynchronous reset.

FIG. 6 illustrates waveform of a sense amplifier-based flip-flop with asynchronous reset.

Figure 7:
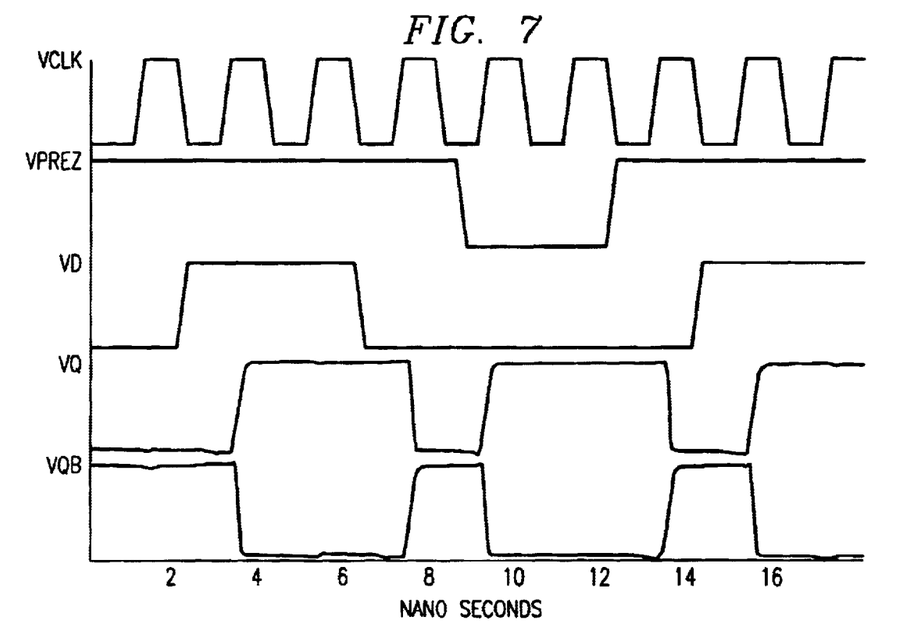
FIG. 7 illustrates waveform of a sense amplifier-based flip-flop with asynchronous preset.

FIG. 7 illustrates waveform of a sense amplifier-based flip-flop with asynchronous preset.

Figure 8:
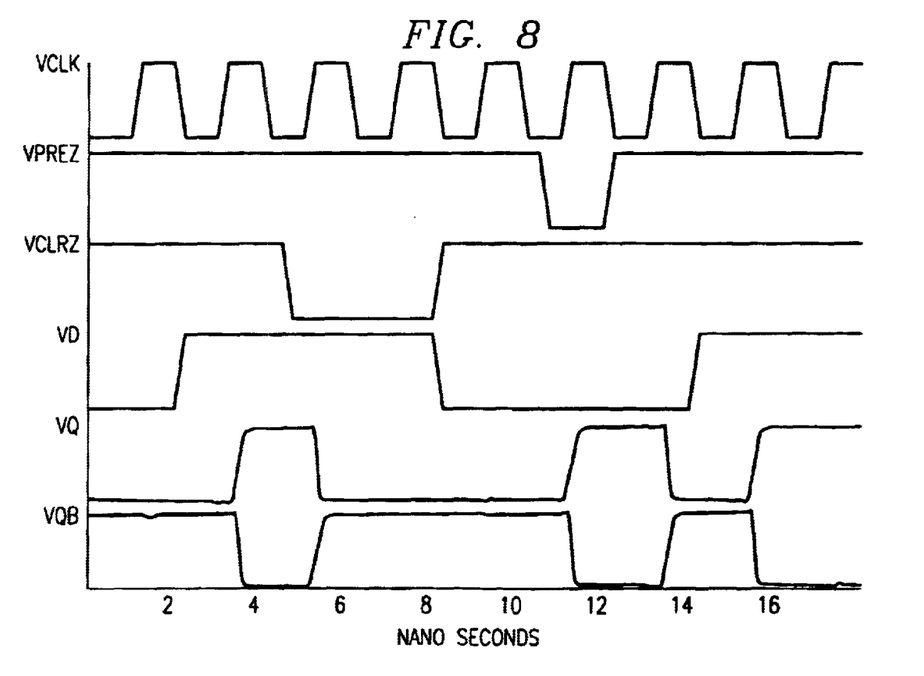
FIG. 8 illustrates waveform of a sense amplifier-based flip-flop with asynchronous reset/preset.

FIG. 8 illustrates waveform of a sense amplifier-based flip-flop with asynchronous reset/preset.

What is claimed is:

1. A flip-flop for asynchronous set and reset, comprising:
   a first stage for inputting a differential set of data inputs and generating a differential set of outputs;
   a set and reset second stage for receiving said set of differential set of outputs from said first stage and to output a differential set of outputs including a Q signal and a $\overline{Q}$ signal from said set and reset second stage, wherein said signal Q and signal $\overline{Q}$ have equal delay times.

2. A flip-flop for asynchronous set and reset, as in claim 1, wherein the delay of rise and fall transitions for both said signal Q and said signal $\overline{Q}$ is equal in asynchronous mode of operation.

3. A flip-flop for asynchronous set and reset, as in claim 1, wherein the delay of rise and fall transitions for both said signal Q and said signal $\overline{Q}$ is equal in asynchronous mode when set and reset are asserted.

4. A flip-flop for asynchronous set and reset, as in claim 1, wherein said flip-flop further comprises a circuit to prevent precharge of said first stage to provide asynchronous mode of operation.

5. A flip-flop for asynchronous set and reset, comprising:
   a first stage for inputting a differential set of data inputs and generating a differential set of outputs;
   a set and reset second stage for receiving said set of differential set of outputs from said first stage and to output a differential set of outputs including a Q signal and $\overline{Q}$ signal from said set and reset second stage; and
   a circuit to provide asynchronous operation for said first stage.

6. A flip-flop for asynchronous set and reset, comprising:
   a first stage for inputting a differential set of data inputs and generating a differential set of outputs, said outputs being a set signal and a reset signal;
   a set and reset second stage for receiving said set of differential set of outputs from said first stage and to output a differential set of outputs including a Q signal and a $\overline{Q}$ signal from said set and reset second stage; and
   a circuit to provide asynchronous operation of said set signal.

7. A flip-flop for asynchronous set and reset, comprising:
   a first stage for inputting a differential set of data inputs and generating a differential set of outputs, said outputs being a set signal and a reset signal;
   a set and reset second stage for receiving said set of differential set of outputs from said first stage and to output a differential set of outputs including a Q signal and a $\overline{Q}$ signal from said set and reset second stage; and
   a circuit to provide asynchronous operation of said reset signal.

8. A flip-flop for asynchronous set and reset, comprising:
   a first stage for inputting a differential set of data inputs and generating a differential set of outputs, said outputs being a set signal and a reset signal;
   a set and reset second stage for receiving said set of differential set of outputs from said first stage and to output a differential set of outputs including a Q signal and a $\overline{Q}$ signal from said set and reset second stage; and
   a circuit to provide asynchronous operation of said set and reset signals and to prevent short circuit connection when $\overline{Set}$ and $\overline{Clear}$ are asserted.

* * * * *